United States Patent
Lefevre et al.

(10) Patent No.: US 12,308,250 B2
(45) Date of Patent: May 20, 2025

(54) PRE-ETCH TREATMENT FOR METAL ETCH

(71) Applicant: Tokyo Electron Limited, Tokyo (JP)

(72) Inventors: Scott Lefevre, Albany, NY (US); Angelique Raley, Albany, NY (US)

(73) Assignee: Tokyo Electron Limited, Tokyo (JP)

(*) Notice: Subject to any disclaimer, the term of this patent is extended or adjusted under 35 U.S.C. 154(b) by 429 days.

(21) Appl. No.: 17/742,445

(22) Filed: May 12, 2022

(65) Prior Publication Data

US 2023/0369064 A1    Nov. 16, 2023

(51) Int. Cl.
*H01L 21/3213* (2006.01)
*H01J 37/32* (2006.01)
*H01L 21/02* (2006.01)

(52) U.S. Cl.
CPC .. *H01L 21/32136* (2013.01); *H01J 37/32449* (2013.01); *H01L 21/0234* (2013.01); *H01J 2237/332* (2013.01)

(58) Field of Classification Search
CPC .......... H01J 2237/332; H01J 37/32449; H01L 21/0234; H01L 21/32138; H01L 21/31122; H01L 21/32136
See application file for complete search history.

(56) References Cited

U.S. PATENT DOCUMENTS

| | | | |
|---|---|---|---|
| 6,916,746 B1* | 7/2005 | Hudson | H01L 21/31116 438/712 |
| 2014/0144876 A1* | 5/2014 | Nakagawa | H01J 37/32091 216/51 |
| 2015/0126033 A1* | 5/2015 | LeFevre | H01J 37/32091 438/694 |
| 2015/0262828 A1 | 9/2015 | Brand et al. | |
| 2016/0013067 A1* | 1/2016 | Wang | H01L 21/32136 438/702 |
| 2017/0140930 A1* | 5/2017 | Kao | H01L 21/02123 |

(Continued)

FOREIGN PATENT DOCUMENTS

KR     20190059368 A     5/2019

OTHER PUBLICATIONS

International Search Report and Written Opinion, PCT Application No. PCT/US2023/021589; mailed Sep. 4, 2023, 10 pages.

(Continued)

*Primary Examiner* — Vongsavanh Sengdara
(74) *Attorney, Agent, or Firm* — Slater Matsil, LLP

(57) ABSTRACT

A method of processing a substrate that includes: exposing a substrate to a first plasma including carbon, the substrate including a first layer including a dielectric material and a second layer including a metal, the first plasma forming a first carbonaceous deposit over the first layer and a second carbonaceous deposit over the second layer; exposing the first carbonaceous deposit and the second carbonaceous deposit to a second plasma including halogen, the second plasma selectively etching the second carbonaceous deposit relative to the first carbonaceous deposit to expose a surface of the second layer; and exposing the first carbonaceous deposit and the exposed surface of the second layer to the second plasma to selectively etch the second layer relative to the first carbonaceous deposit, the first carbonaceous deposit protecting the first layer from being etched by the second plasma.

20 Claims, 8 Drawing Sheets

(56) References Cited

U.S. PATENT DOCUMENTS

| | | | |
|---|---|---|---|
| 2017/0243757 A1* | 8/2017 | Ranjan | H01L 21/02252 |
| 2017/0338120 A1* | 11/2017 | Kobayashi | H01L 21/28512 |
| 2019/0006150 A1* | 1/2019 | Shim | H01J 37/32183 |
| 2020/0388533 A1* | 12/2020 | You | H01L 21/02063 |
| 2021/0043506 A1* | 2/2021 | Shaviv | H01L 21/76865 |
| 2021/0335623 A1* | 10/2021 | Iwano | H01J 37/32449 |
| 2021/0407801 A1* | 12/2021 | Venkatasubramanian | C23C 16/272 |
| 2021/0407818 A1 | 12/2021 | Ritala et al. | |
| 2022/0059366 A1* | 2/2022 | Fung | H01L 21/32136 |

OTHER PUBLICATIONS

Hellriegel et al., "Remote plasma etching of titanium nitride using NF3/argon and chlorine mixtures for chamber clean applications," Microelectronic Engineering 84, pp. 37-41, Sep. 1, 2006, 5 pages.

Min et al., "Inductively coupled plasma reactive ion etching of titanium nitride thin films in a Cl2/Ar plasma," Journal of Industrial and Engineering Chemistry 14, Jan. 14, 2008, pp. 297-302, 6 pages.

Raley et al., "Self-Aligned Blocking Integration Demonstration for Critical sub 40nm pitch Mx Level Patterning," Advanced Etch Technology for Nanopatterning VI, Proc. of SPIE vol. 10149, pp. 101490O-1-101490O-11, downloaded Jul. 31, 2017, 11 pages.

Sharma et al., "Thermal gas-phase etching of titanium nitride (TiN) by thionyl chloride (SOCl2)," Applied Surface Science, Nov. 4, 2020, 8 pages.

Vitale et al., "High density plasma etching of titanium nitride metal gate electrodes for fully depleted silicon-on- Insulator subthreshold transistor integration," Journal of Vacuum Science & Technology B 27, American Vacuum Society, pp. 2472-2479, Nov. 30, 2009, 9 pages.

\* cited by examiner

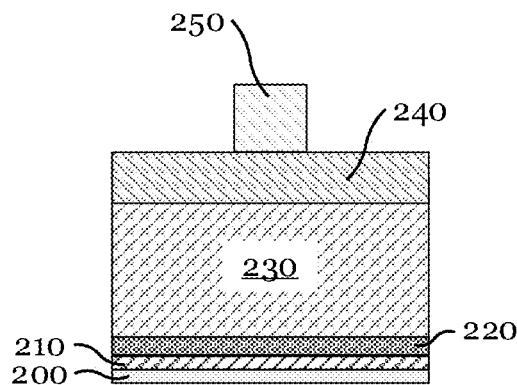
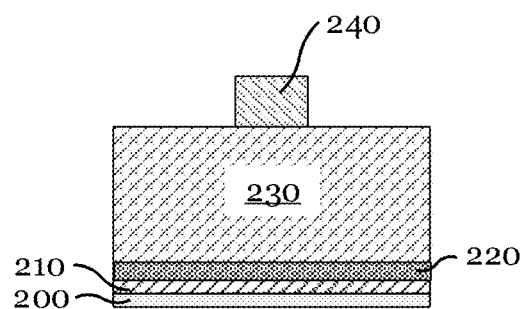
FIG. 2A  FIG. 2B
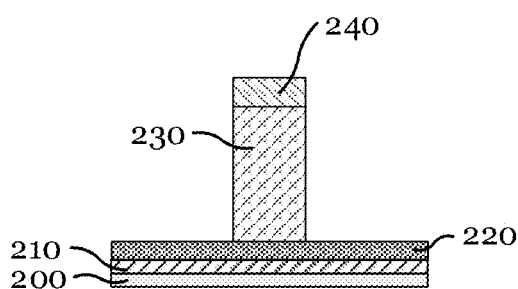
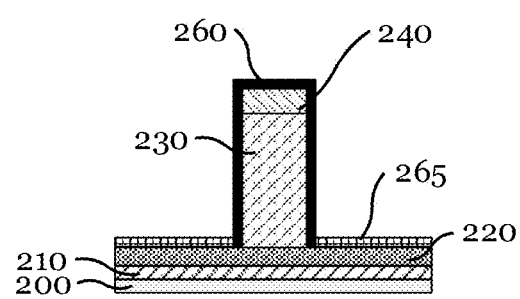
FIG. 2C  FIG. 2D
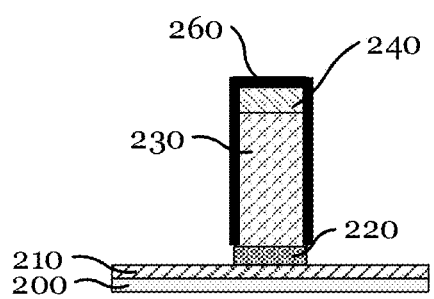
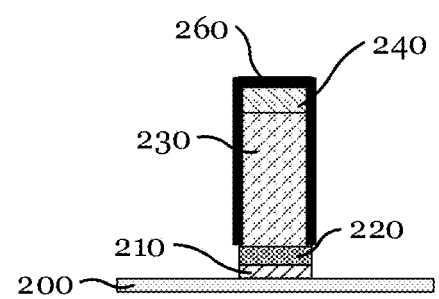
FIG. 2E  FIG. 2F

PRE-ETCH TREATMENT FOR METAL ETCH

TECHNICAL FIELD

The present invention relates generally to a method of processing a substrate, and, in particular embodiments, to a pre-etch treatment for etching metal.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices is performed using plasma processes.

The semiconductor industry has repeatedly reduced the minimum feature sizes in semiconductor devices to a few nanometers to increase the packing density of components. Accordingly, the semiconductor industry increasingly demands plasma-processing technology to provide processes for patterning features with accuracy, precision, and profile control, often at atomic scale dimensions. These requirements are particularly stringent for three-dimensional (3D) structures, for example, a fin field-effect transistor (FinFET) wherein the gate electrode wraps around three sides of closely-spaced, narrow and long fin-shaped semiconductor features formed by etching trenches into the semiconductor substrate. Meeting this challenge along with the uniformity and repeatability needed for high volume IC manufacturing requires further innovations of plasma processing technology.

SUMMARY

In accordance with an embodiment of the present invention, a method of processing a substrate that includes: exposing a substrate to a first plasma generated from a pretreatment gas including carbon, the substrate including a first layer including a dielectric material and a second layer including a metal, the first plasma being exposed to the first layer and the second layer, the first plasma forming a first carbonaceous deposit over the first layer and a second carbonaceous deposit over the second layer, the first carbonaceous deposit having a different composition than the second carbonaceous deposit; exposing the first carbonaceous deposit and the second carbonaceous deposit to a second plasma generated from an etch gas including halogen, the second plasma selectively etching the second carbonaceous deposit relative to the first carbonaceous deposit to expose a surface of the second layer; and exposing the first carbonaceous deposit and the exposed surface of the second layer to the second plasma to selectively etch the second layer relative to the first carbonaceous deposit, the first carbonaceous deposit protecting the first layer from being etched by the second plasma.

In accordance with an embodiment of the present invention, a method of processing a substrate that includes: exposing a substrate to a first halogen-containing plasma to etch a portion of a first layer including a dielectric material and expose a second layer disposed under the first layer, the second layer including a metal; exposing the remaining portions of the first layer and the exposed second layer to a carbon-containing plasma to form a first carbonaceous deposit over the remaining portions of the first layer and a second carbonaceous deposit over the exposed second layer; exposing the first carbonaceous deposit and the second carbonaceous deposit to a second halogen-containing plasma to selectively etch the second carbonaceous deposit relative to the first carbonaceous deposit to expose a surface of the exposed second layer; and exposing the first carbonaceous deposit and the exposed surface of the exposed second layer to the second plasma to selectively etch the second layer relative to the first carbonaceous deposit.

In accordance with an embodiment of the present invention, a method of processing a substrate that includes: forming a plurality of regions over the substrate, the plurality of regions including stack of layers and including a nitride layer, an oxide layer, and an organic dielectric layer; etching through the plurality of regions by exposing the substrate to a first halogen-containing plasma to form an opening in the plurality of regions and exposing an underlying metal-containing film; forming carbonaceous deposits over the plurality of regions by exposing the substrate to a carbon-containing plasma; and selectively etching the metal-containing film relative to portions of the carbonaceous deposits over the nitride layer, the oxide layer, and the organic dielectric layer, by exposing the substrate to a second halogen-containing plasma, the portions of the carbonaceous deposits protecting the nitride layer, the oxide layer, and the organic dielectric layer from being etched by the second halogen-containing plasma.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1F illustrate cross sectional views of two example substrates during an example selective metal etch process in accordance with various embodiments, wherein FIG. 1A illustrates a first substrate comprising a dielectric material, FIG. 1B illustrates a second substrate comprising a metal, FIG. 1C illustrates the first substrate after a plasma pretreatment step, FIG. 1D illustrates the second substrate after the plasma pretreatment step, FIG. 1E illustrates the first substrate after a plasma metal etch treatment, and FIG. 1F illustrates the second substrate after the plasma metal etch treatment;

FIGS. 2A-2F illustrate cross sectional views of an example substrates during a semiconductor fabrication process comprising a selective metal etch process in accordance with various embodiments, wherein FIG. 2A illustrates an incoming substrate comprising a layer stack and a patterned photoresist, FIG. 2B illustrates the substrate after patterning a hard mask layer, FIG. 2C illustrates the substrate during a gate stack etch, FIG. 2D illustrates the substrate after a plasma pretreatment step of the selective metal etch process, FIG. 2E illustrates the substrate after a metal etch step of the selective metal etch process, and FIG. 2F illustrates the substrate after the gate stack etch;

FIG. 3A illustrates the incoming substrate 300 comprising a layer stack having two metal-containing liners.

FIGS. 7A-7C illustrate process flow charts of methods of selective metal etch process in accordance with various embodiments, wherein FIG. 7A illustrates certain embodiment process flows, FIG. 7B illustrates alternate embodiment process flows, and FIG. 7C illustrates yet other embodiment process flows.

DETAILED DESCRIPTION OF ILLUSTRATIVE EMBODIMENTS

This application relates to a method of processing a substrate, more particularly to a pre-etch treatment for selectively etching metal. A selective metal etch process described in this disclosure comprises a plasma pretreatment step that forms carbonaceous deposits over the substrate and a subsequent plasma etch step that selectively etches a portion comprising metals. As the complexity of semiconductor device fabrication increases, it becomes more imperative to selectively add and remove different types of dielectric, semiconducting, and conductive materials during the fabrication. It may also be desired to simultaneously etch multiple materials with varying selectivity for process efficiency. However, effectively removing a metal-containing film selectively may be challenging in a single-step plasma etch process. For example, a conventional plasma etch using halogen may be effective in removing the metal-containing film but not selective to dielectric materials such as silicon oxide, silicon nitride, and organic dielectric. Embodiments of the present application disclose methods of selective metal etch using a plasma pretreatment step, where a carbonaceous deposit formed by the plasma pretreatment step selectively protects other materials from being etched during the metal etch step.

The methods described in this disclosure may advantageously improve complex patterning schemes that involve a metal-containing film in semiconductor fabrication. For example, titanium nitride (TiN), which is widely used as a gate metal and diffusion-barrier metal in complementary metal-oxide semiconductor (CMOS) devices, may be etched selectively. Only a short period of time, for example, less than 30 s may be required for the plasma pretreatment step. The etch selectivity can be tuned by the plasma pretreatment process time. In certain embodiments, varying the plasma pretreatment process time may also enable etch selectivity between two metal-containing films (e.g., TiN and AlO). In various embodiments, the selective metal etch process may be inserted during a dielectric etch of a layer stack. For example, the method may be used as a part of self-alignment block (SAB) process in back end of line (BEOL) trench patterning.

Figure 4:
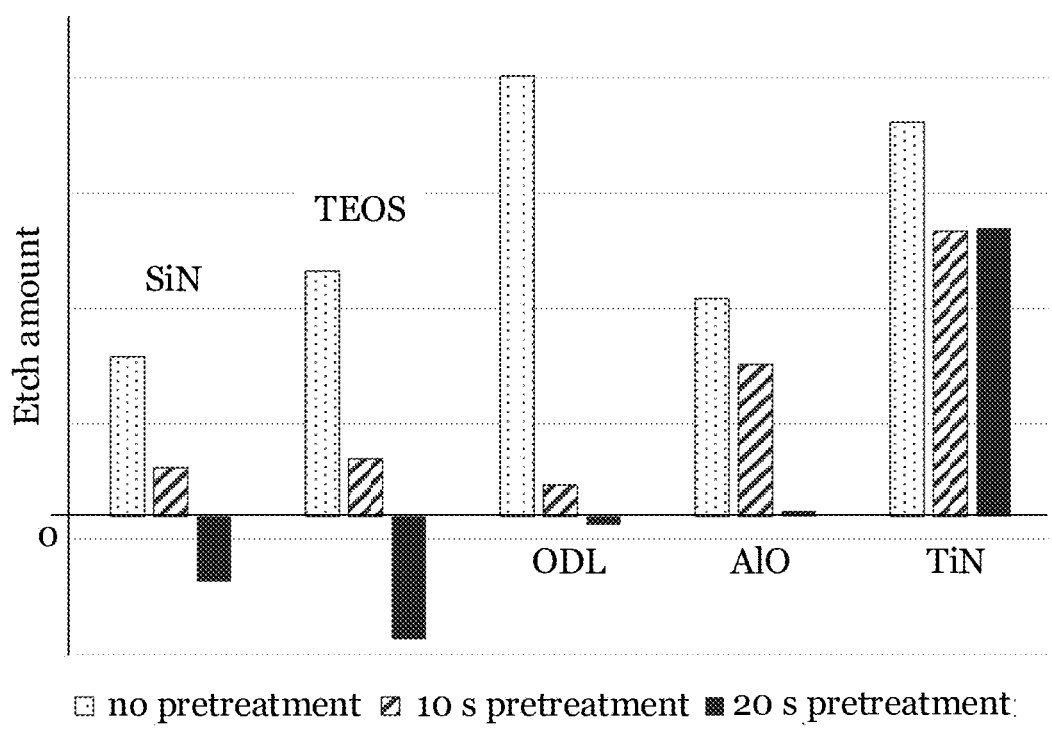
FIG. 4 illustrates the effect of the plasma pretreatment step on the etch amount of various materials during a plasma etch process.
Figure 5:
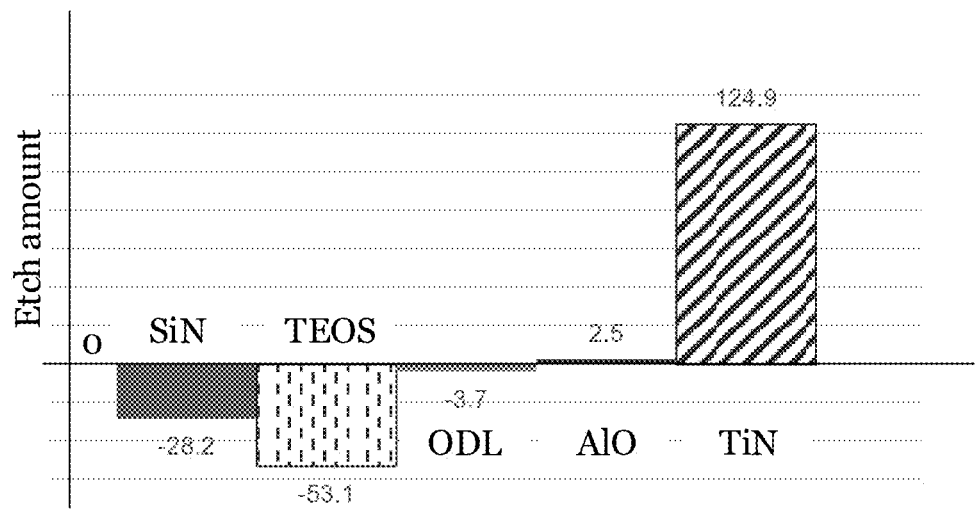
FIG. 5 illustrates the etch amount of various materials during the selective metal etch process.
Figure 6:
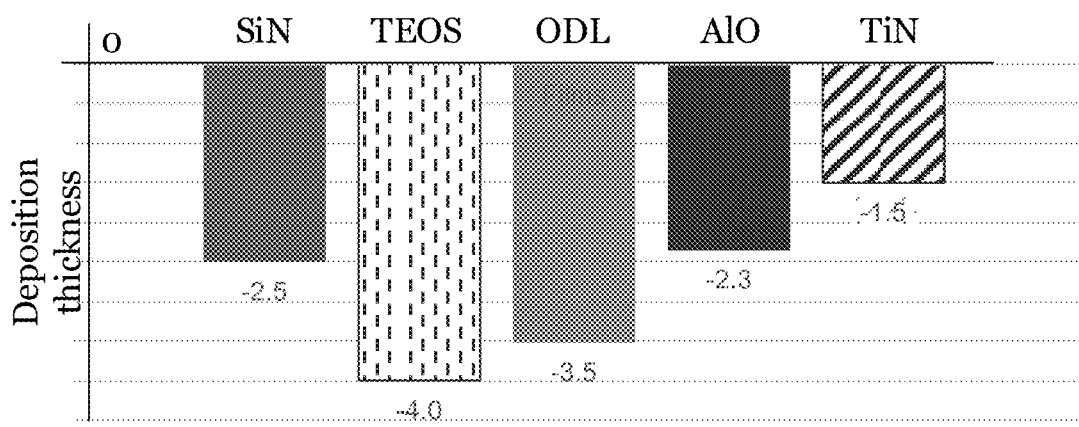
FIG. 6 illustrates the amount of deposition formed on various materials during the plasma pretreatment step.
Figure 7A:
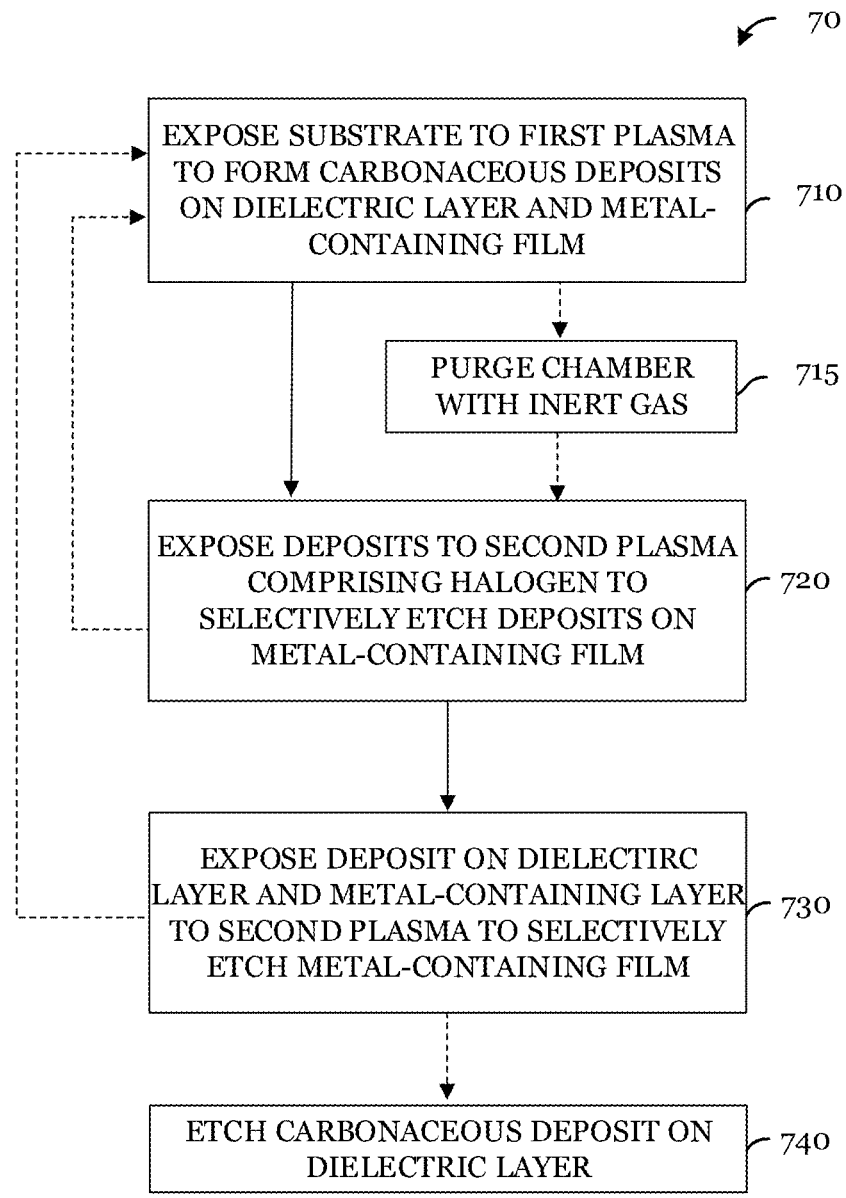
Figure 7B:
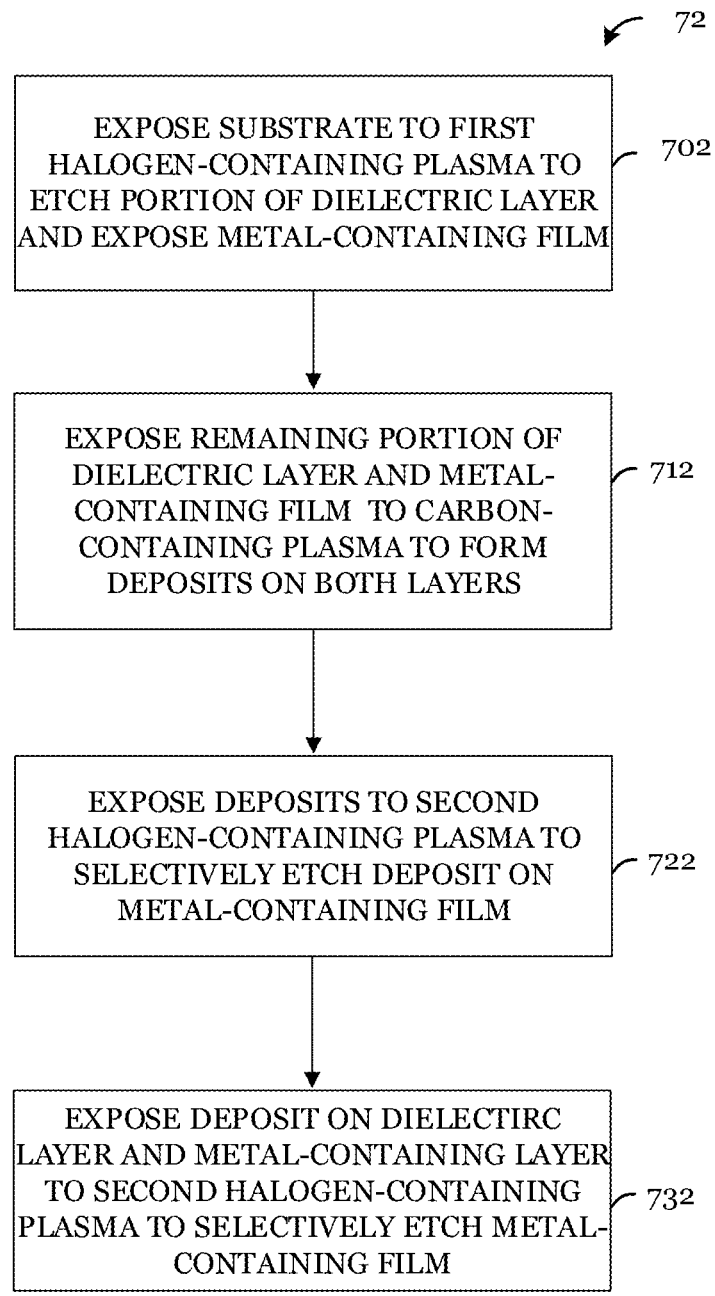
Figure 7C:
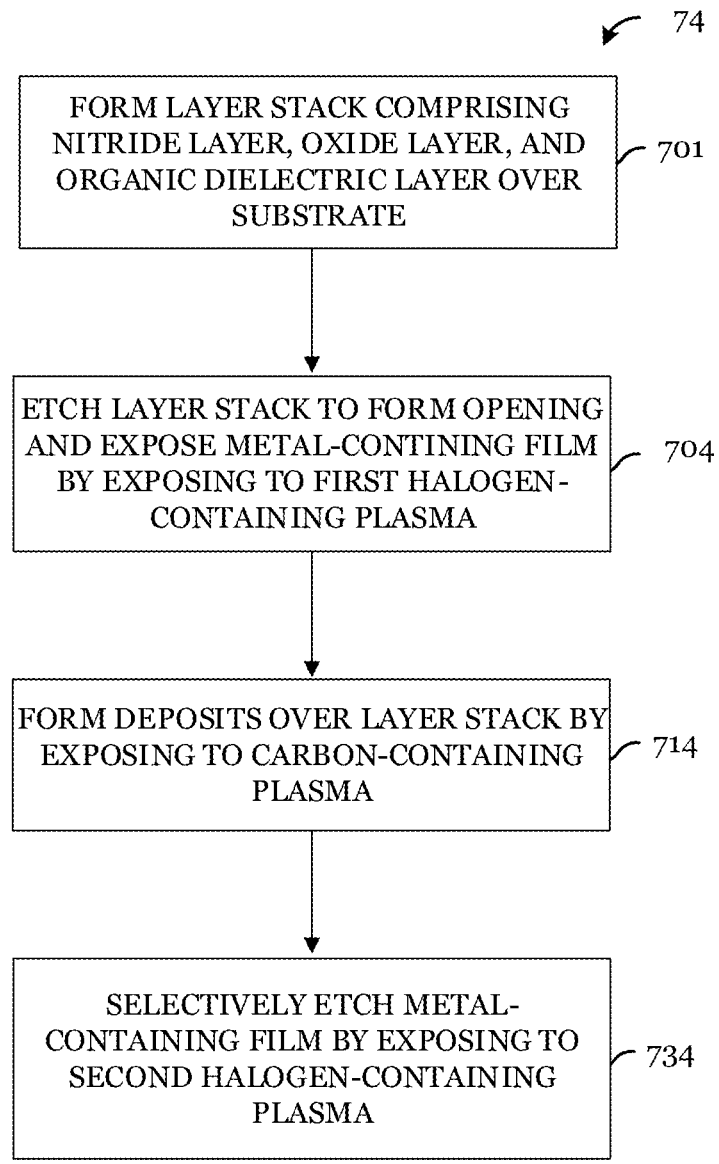

In the following, steps of the selective metal etch process are first described referring to FIGS. 1A-1F in accordance with various embodiments. Example applications of the selective metal etch process in semiconductor fabrication are then described referring to FIGS. 2A-2F and 3A-3C. The deposition and etch amount caused by the plasma pretreatment step and by the plasma etch step for various materials are illustrated in FIGS. 4-6. Example process flow diagrams are illustrated in FIG. 7A-7C. All figures in this disclosure are drawn for illustration purpose only and not to scale, including the aspect ratios of features.

FIGS. 1A-1F illustrate cross sectional views of two example substrates during an example selective metal etch process in accordance with various embodiments.

Figure 1A:
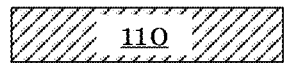
Figure 1C:
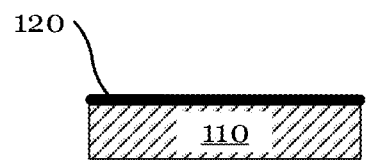
Figure 1E:
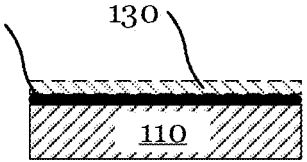
Figure 1B:
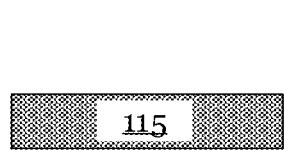

FIG. 1A illustrates a first substrate 110 comprising a dielectric material and FIG. 1B illustrates a second substrate 115 comprising a metal.

In various embodiments, the dielectric material may comprise silicon oxide, silicon nitride (SiN), or organic dielectric, and the metal may comprise titanium (Ti) or aluminum (Al). In certain embodiments, the second substrate 115 may comprise metal nitride (e.g., TiN) or metal oxide (e.g., AlO). Accordingly, the second substrate 115 may comprise a metal-containing dielectric material.

Figure 1D:
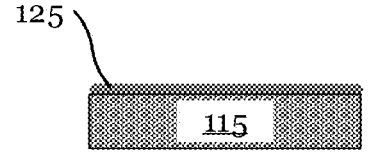

FIGS. 1C and 1D illustrate the first substrate 110 and the second substrate 115 after a plasma pretreatment step of the selective metal etch process under the same process conditions, respectively.

The plasma pretreatment step forms carbonaceous deposits as thin films: a first carbonaceous deposit 120 over the first substrate 110 (FIG. 1C) and a second carbonaceous deposit 125 over the second substrate 115 (FIG. 1D). The plasma pretreatment step may be performed in a plasma processing chamber by exposing the substrate to a plasma generated by a pretreatment gas comprising carbon as a precursor. The carbonaceous deposits may be formed, for example, as a polymeric film. Because of the difference in composition between the two substrates, deposition mechanisms at surface may also be different. Accordingly, in certain embodiments, the first carbonaceous deposit 120 and the second carbonaceous deposit 125 may have different compositions, but in other embodiments, their compositions may be the same.

In various embodiments, the pretreatment gas may comprise a hydrocarbon. In certain embodiments, the pretreatment gas may comprise methane ($CH_4$). In one or more embodiments, the pretreatment gas may be a gas mixture comprising dihydrogen ($H_2$). In certain embodiments, an inert gas (e.g., noble gas and dinitrogen) may also be added to the pretreatment gas. In one embodiment, the pretreatment gas may comprise $CH_4$ and $H_2$.

Although not wishing to be limited by any theory, during the plasma pretreatment step, a radical-rich conditions of the plasma may be desired for the formation of the carbonaceous deposits. To achieve the radical-rich environment, a sufficiently high source power may be applied. In one embodiment, a relatively low bias power may be preferred, but in other embodiments, any level of bias power may be used for controlling the anisotropy of the plasma pretreatment step as long as the damage to materials not be etched is kept minimal. In various embodiments, the source power may be between 50 W and 1000 W and the bias power may be between 0 W and 200 W. Total gas flow may be between 20 to 1000 sccm. Process pressure may be between 5 to 100 mTorr. The desired directionality (i.e., isotropy/anisotropy) of the plasma pretreatment step may vary depending on applications. In certain embodiments, process conditions may be selected to achieve a conformal, isotropic formation of the carbonaceous deposits by the plasma pretreatment step. In another embodiment, however, a certain level of anisotropic formation may be desired such that the deposits are mostly formed over the stop surfaces and not on sidewalls in a recess. Such an embodiment may be advantageous in, for example, a spacer open etch process of multiple patterning scheme.

In various embodiments, the plasma pretreatment process time may be controlled to achieve a desired thickness of the carbonaceous deposits. In certain embodiments, the carbonaceous deposits may be formed as thin films having a thickness less than 1 nm. In one or more embodiments, the plasma pretreatment process time may be between 1 s and 60 s. In one embodiment, a short process time between 5 s and 30 s may be advantageously sufficient to form the carbonaceous deposits that can provide the selectivity in the subsequent plasma metal etch step.

Figure 1F:
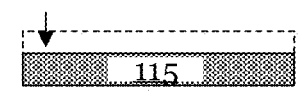

FIGS. 1E and 1F illustrates the first substrate 110 and the second substrate 115 after a plasma metal etch step under the same process conditions, respectively.

The plasma metal etch step may be performed in a plasma processing chamber by exposing the substrate to a plasma generated from an etch gas. As illustrated in FIGS. 1E and 1F, the first carbonaceous deposit 120 formed over the first substrate 110 may function as a protective layer during the plasma metal etch step, and thereby no etching of the dielectric material of the first substrate 110 may occur. Furthermore, in certain embodiments, the plasma metal etch step may even cause the deposition of an additional layer 130 (FIG. 1E). On the other hand, the second carbonaceous deposit 125 formed over the second substrate 115 may be completely removed to expose the surface of the second substrate 115, and the etching of the metal of the second substrate 115 may occur (FIG. 1F).

In various embodiments, the etch gas may comprise halogen. In certain embodiments, the etch gas may comprise $BCl_3$, $Cl_2$, HBr, $CF_4$, $CHF_3$, or $NF_3$. In further embodiments, the etch gas may comprise non-halogen gas such as dioxygen ($O_2$). In certain embodiments, an inert gas (e.g., noble gas and dinitrogen) may also be added to the etch gas.

In the plasma metal etch step, in certain embodiments, it is important to achieve a condition for anisotropic etching particularly when etching a high aspect ratio feature. For the anisotropic etching conditions, a relatively high bias power is desired compared with the plasma pretreatment step. In various embodiments, the source power may be between 10 and 1000 W and the bias power may be between 50 and 500 W. Total gas flow may be between 20 to 1000 sccm. Process pressure may be between 5 to 100 mTorr. In other embodiments, the plasma conditions for the plasma metal etch step may be selected to reduce the anisotropy of the plasma metal etch step by, for example, increasing the pressure in the plasma processing chamber and/or lowering the bias power.

In various embodiments, both the plasma pretreatment step and the plasma metal etch step may be advantageously performed in the same plasma processing chamber. In one or more embodiments, switching from the plasma pretreatment step to the plasma metal etch step may be performed by switching the gas composition flowed into the plasma processing chamber without turning off the source power or bias power completely. In certain embodiments, the plasma pretreatment step and the plasma metal etch step may be repeated as a part of a cyclic plasma process. Such a cyclic embodiment of the selective metal etch process may be advantageous for the substrate comprising multiple metal-containing regions and/or multiple levels of layers (e.g., 3D structures) because each cycle may be tuned according to the target layers and materials to be protected and etched.

FIGS. 2A-2D illustrate cross sectional views of example substrates 200 during a semiconductor fabrication process comprising a selective metal etch process in accordance with various embodiments. In the illustrated embodiments, a gate stack etch process during the fabrication of a metal-oxide-semiconductor field-effect transistor (MOSFET) comprising a dielectric and a metal gate is described. However, the selective metal etch process may be applicable generally to any fabrication process that requires selective etching of a metal-containing layer. In one or more embodiments, the selective metal etch process may be a part of a BEOL fabrication and/or a process to form a metal line.

In FIG. 2A, the incoming substrate 200 comprises a layer stack and a patterned photoresist layer 250. In various embodiments, the substrate 200 may be a part of, or include, a semiconductor device, and may have undergone a number of steps of processing following, for example, a conventional process. The substrate 200 accordingly may comprise layers of semiconductors useful in various microelectronics. For example, the semiconductor structure may comprise the substrate 200 in which various device regions are formed.

In one or more embodiments, the substrate 200 may be a silicon wafer, or a silicon-on-insulator (SOI) wafer. In certain embodiments, the substrate 200 may comprise a silicon germanium wafer, silicon carbide wafer, gallium arsenide wafer, gallium nitride wafer and other compound semiconductors. In other embodiments, the substrate 200 comprises heterogeneous layers such as silicon germanium on silicon, gallium nitride on silicon, silicon carbon on silicon, as well layers of silicon on a silicon or SOI substrate. In various embodiments, the substrate 200 is patterned or embedded in other components of the semiconductor device.

In FIG. 2A, the layer stack of the substrate 200 may comprise a dielectric layer 210, a metal gate layer 220, a polysilicon layer 230, and a hard mask layer 240. The description of the layer stack structure below is for example only, and other reasonable structures are possible in other embodiments. In various embodiments, the dielectric layer 210 may comprise silicon oxide. In certain embodiments, the dielectric layer 210 may comprise a high-K dielectric material such as tantalum oxide, hafnium oxide, zirconium oxide, hafnium silicates, and aluminum oxide. The dielectric layer 210 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes.

Above the dielectric layer 210, the metal gate layer 220 may be deposited using similar deposition techniques as listed above. In various embodiments, the metal gate layer 220 may comprise titanium nitride (TiN). In one or more embodiments, the thickness of the metal gate layer 220 may be between about 10 nm and about 100 nm.

Above the metal gate layer 220, the polysilicon layer 230 may be formed. The polysilicon used in the polysilicon layer 230 may comprise a doped polysilicon to have desired material properties including electrical properties. The polysilicon layer 230 may be deposited over the metal gate layer 220 using appropriate deposition techniques as listed above. In one or more embodiments, the polysilicon layer 230 may have a thickness of about 50 nm to about 500 nm.

Still referring to FIG. 2A, the hard mask layer 240 may be formed over the polysilicon layer 230. The hard mask layer 240 may comprise silicon oxide in one embodiment. The silicon oxide may be prepared for example by plasma-enhanced CVD or flowable CVD using tetraethyl orthosilicate (TEOS) as a precursor. In various embodiments, the hard mask layer 240 may comprise silicon nitride, silicon carbonitride (SiCN), or silicon oxycarbide (SiOC). In one or more embodiments, the hard mask layer 240 may comprise other suitable organic materials such as spin-on carbon hard mask (SOH) materials. The hard mask layer 240 may be deposited using suitable deposition techniques as listed above, or other processes including wet processes. The hard mask layer 240 may have a thickness of about 5 nm to about 50 nm in various embodiments. In one or more embodiments, an additional layer such as silicon-containing anti-reflective coating films (SiARC) or other ARC films may be formed over the hard mask layer 240.

The patterned photoresist layer 250 may be formed over the hard mask layer 240. In various embodiments, the patterned photoresist layer 250 provides a pattern to form respective features in the underlying layer stack. In the illustrated example, the patterned photoresist layer 250 serves as a first etch mask when forming respective features in the hard mask layer 240 (FIG. 2B), and subsequently the formed features in the hard mask layer 240 may serve as a second etch mask during a plasma process to etch the polysilicon layer 230, the metal gate layer 220, and the dielectric layer 210 (FIGS. 2C and 2D). In certain embodiments, the patterned photoresist layer 250 may comprise 248 nm resists, 193 nm resists, 157 nm resists, EUV (extreme ultraviolet) resists, or electron beam (EB) sensitive resists. In various embodiments, a photoresist may be deposited over the hard mask layer 240 using a dry process or wet process, for example, a spin-coating technique. The deposited photoresist may be then patterned with an appropriate lithographic process to form the patterned photoresist layer 250. In one embodiment, the patterned photoresist layer 250 has a thickness between 20 nm and 100 nm.

FIG. 2B illustrates the cross-sectional view of the substrate 200 after patterning the hard mask layer 240.

The hard mask layer 240 may be patterned using a plasma etch process, for example, a reactive ion etching (RIE) process. The section of the hard mask layer 240 that is not masked by the patterned photoresist layer 250 may be removed, thereby transferring the pattern defined by the patterned photoresist layer 250 to the hard mask layer 240. As illustrated in FIG. 2B, at least a portion of the polysilicon layer 230 may be exposed. In one or more embodiments, the substrate 200 may comprise additional layers above and/or below the hard mask layer 240, and the additional layers may also be removed during this etch step. In one or more embodiments, although not illustrated in FIG. 2B, some of the patterned photoresist layer 250 may remain during subsequent steps, but may be removed at any stage in other embodiments.

FIG. 2C illustrates the cross-sectional view of the substrate 200 during a gate stack etch.

After patterning the hard mask layer 240, the polysilicon layer 230 may be etched in an etch back step, for example, using a reactive ion etching (RIE) process. As illustrated in FIG. 2C, at least a portion of the metal gate layer 220 may be exposed. In various embodiments, this etch back step may be timed to expose the top surfaces of the metal gate layer 220. Alternatively, the etch back step may be stopped at an optional etch stop layer in certain embodiments. Once the portion of the metal gate layer 220 is exposed, the method of selective metal etch process may be applied for patterning the metal gate layer 220.

FIG. 2D illustrates the cross-sectional view of the substrate 200 after a plasma pretreatment step of the selective metal etch process.

The plasma pretreatment step may be performed as previously described in the prior embodiments. Exposing the substrate 200 to a plasma comprising carbon (e.g., $CH_4/H_2$ mixture in one embodiment) may lead to the formation of a first carbonaceous deposit 260 over the hard mask layer 240 and a second carbonaceous deposit 265 over the metal gate layer 220. In certain embodiments, the first carbonaceous deposit 260 may be formed on the sidewalls of the hard mask layer 240. In one or more embodiments, as illustrated in FIG. 2D, the first carbonaceous deposit 260 may also extend to cover the sidewalls of the polysilicon layer 230.

FIG. 2E illustrates the cross-sectional view of the substrate 200 after a metal etch step of the selective metal etch process.

The plasma metal etch step of the selective metal etch process may be performed as previously described in the prior embodiments. Exposing the substrate 200 to a plasma comprising halogen may remove the second carbonaceous deposit 265 in FIG. 2D to expose the metal gate layer 220. The exposed portion of the metal gate layer 220 may then be etched during this step while avoiding damaging the other portions (e.g., the hard mask layer 240). In FIG. 2E, the first carbonaceous deposit 260 preventing the etching of the hard mask layer 240 and the polysilicon layer 230. In certain embodiments, process conditions for the plasma metal etch step of the selective metal etch process may be selected to enable anisotropic etching.

FIG. 2F illustrates the substrate after the gate stack etch.

In various embodiments, in addition to the metal gate layer 220, the selective metal etch process may also remove a portion of the dielectric layer 210 as illustrated in FIG. 2F, if the dielectric layer 210 comprises a metal. Such examples for the dielectric layer 210 may include hafnium oxide and aluminum oxide. In other embodiments, the dielectric layer 210 may comprise a silicon-based material such as silicon dioxide, and the selective metal etch process only removes the metal gate layer 220. In other words, depending on the compositions of the metal gate layer 220 and the dielectric layer 210, the patterning of these two layers illustrated in FIG. 2F may be performed solely by the selective metal etch process or by a series of etch processes with different process conditions.

After completing the patterning of the metal gate layer 220 and the dielectric layer 210, the semiconductor fabrication process may proceed to subsequent steps such as ion implantation for source/drain formation and/or spacer formation.

In various embodiments, the fabrication steps described above (FIGS. 2A-2D), including the selective metal etch process, may be advantageously performed in a single plasma processing chamber equipped with one or more plasma sources such as inductively coupled plasma (ICP), capacitively couple plasma (CCP), microwave plasma (MW), or others. In certain embodiments, the selective metal etch process may advantageously be performed to etch more than one metals selective to other materials.

Figure 3A:
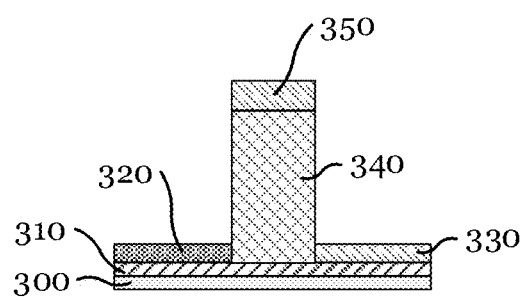
FIGS. 3A-3C illustrate cross sectional views of an example substrates during a semiconductor fabrication process comprising a selective metal etch process in accordance with alternate embodiments.
Figure 3B:
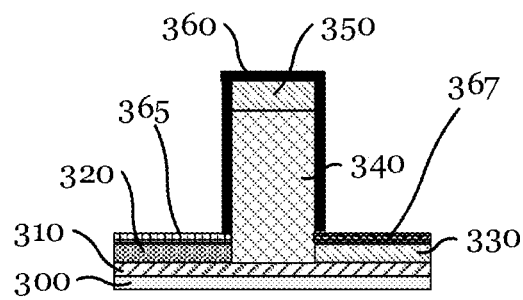
Figure 3C:
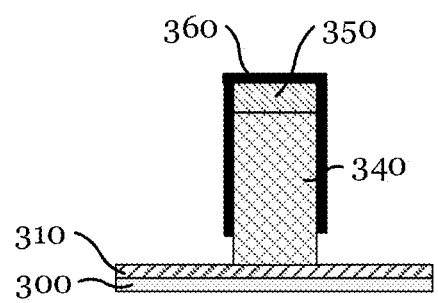

FIGS. 3A-3C illustrate cross sectional views of an example substrates 300 during a semiconductor fabrication process comprising a selective metal etch process in accordance with alternate embodiments. FIG. 3A illustrates an incoming substrate comprising a layer stack having two metal-containing liners.

In FIG. 3A, the incoming substrate 300 comprises a layer stack. In various embodiments, the substrate 300 may be a part of, or include, a semiconductor device. The layer stack of the substrate 300 may comprise a dielectric layer 310, a patterned interlevel dielectric (ILD) layer 340, and a hard mask layer 350. In FIG. 3A, the layer stack may further comprise two metal-containing liners deposited over the dielectric layer 310 and separated from each other by the patterned ILD layer 340: a first metal-containing liner 320 and a second metal-containing liner 330. In various embodiments, the first metal-containing liner 320 may comprise a first metal and the second metal-containing liner 330 may comprise a second metal. In one embodiment, the first metal-containing liner 320 may comprise titanium nitride (TiN) and the second metal-containing liner 330 may comprise aluminum oxide. In certain embodiments, the thickness of the two metal-containing liners may be between 1 nm and 20 nm. The dielectric layer 310, the patterned ILD layer 340, or the hard mask layer 350 may comprise silicon-based materials. These two liners may advantageously be removed by the selective metal etch process without damaging the patterned ILD layer 340.

FIG. 3B illustrates the cross-sectional view of the substrate 300 after a plasma pretreatment step of the selective metal etch process.

The plasma pretreatment step may be performed as previously described in the prior embodiments. Exposing the substrate 300 to a plasma comprising carbon (e.g., $CH_4/H_2$ mixture in one embodiment) may lead to the formation of a first carbonaceous deposit 360 over the hard mask layer 350. In certain embodiments, the first carbonaceous deposit 360 may be formed on the sidewalls of the hard mask layer 240. In one or more embodiments, as illustrated in FIG. 3B, the first carbonaceous deposit 360 may also extend to cover the sidewalls of the ILD layer 340. At this stage, a second carbonaceous deposit 265 and a third carbonaceous deposit 367 may also be formed, over the first metal-containing liner 320 and the second metal-containing liner 330, respectively. Because of the difference in composition between the surfaces, deposition mechanisms at surface may also be different. Accordingly, in certain embodiments, the first carbonaceous deposit 360, the second carbonaceous deposit 365, and the third carbonaceous deposit 367 may have different compositions, but in other embodiments, their compositions may be the same.

FIG. 3C illustrates the cross-sectional view of the substrate 300 after a metal etch step of the selective metal etch process.

The plasma metal etch step of the selective metal etch process may be performed as previously described in the prior embodiments. Exposing the substrate 300 to a plasma comprising halogen may remove the second carbonaceous deposit 365 and the third carbonaceous deposit 367 in FIG. 3B to expose the first metal-containing liner 320 and the second metal-containing liner 330. The exposed portion of the first metal-containing liner 320 and the second metal-containing liner 330 may then be etched during this step while avoiding damaging the other portions (e.g., the hard mask layer 350). In FIG. 3C, the first carbonaceous deposit 360 preventing the etching of the hard mask layer 350 and the ILD layer 340.

FIG. 4 illustrates the effect of the plasma pretreatment step on the etch amount of various materials during a plasma etch process.

FIG. 5 illustrates the etch amount of various materials after the selective metal etch process.

In FIG. 4, various materials are compared for their etch amount enabled by the selective metal etch process. As an example, the plasma pretreatment step is performed using a plasma comprising $CH_4/H_2$, and the metal etch step is performed using a plasma comprising $BCl_3$. The five materials studied are silicon nitride (SiN), silicon dioxide prepared from using tetraethyl orthosilicate (TEOS), an organic dielectric material (or organic dielectric layer, ODL), aluminum oxide (AlO), and titanium nitride (TiN). When the materials are etched without a plasma pretreatment step, all of the five materials are etched. In particular, ODL and TiN are etched substantially more than the other three materials, illustrating the absence of etch selectivity of metal. In contrast, performing the plasma pretreatment as described above suppressed the etching of SiN, TEOS, and ODL during the metal etch step, while having much less impacts on AlO and TiN. In the case of the metal etch after the plasma pretreatment for 10 s, the etching of SiN, TEOS, and ODL are reduced substantially but the etching of AlO and TiN are reduced only by about a quarter. Furthermore, when the plasma pretreatment is performed for 20 s, the contrast between the materials becomes larger as illustrated in FIGS. 4 and 5. No etching occurs on SiN, TEOS, and ODL, and rather, some deposits are found over these materials. In addition, the etching of AlO is almost completely suppressed, while the etching of TiN remains at the same level as the 10 s pretreatment case. These results demonstrate that the selective metal etch over silicon dielectric materials and organic dielectric materials is enabled by utilizing a $CH_4/H_2$ plasma pretreatment. Particularly, a short process time for the plasma pretreatment step, for example, 10-20 s, may be sufficient to cause significant etch selectivity. It should also be noted that the process time for the plasma pretreatment step may also be utilized to tune the etch selectivity between different metal-containing materials (e.g., TiN versus AlO).

FIG. 6 illustrates the amount of deposition formed on various materials during the plasma pretreatment step.

In FIG. 6, five materials are characterized for the amount of deposition formed during the plasma pretreatment step. Carbonaceous deposits are formed during the plasma pretreatment step over all the five materials with varying amounts. Although not wishing to be limited by any theory, these results indicates that the carbonaceous deposits effectively prevent SiN, TEOS, and ODL from being etched during the subsequent metal etch step as illustrated above in FIGS. 4 and 5, while on the other hand, the carbonaceous deposits formed over AlO and TiN do not. Instead, over AlO and TiN, the carbonaceous deposits are completely removed during the subsequent metal etch step and the selective etching of AlO and TiN is enabled.

FIGS. 7A-7C illustrate process flow charts of methods of selective metal etch process in accordance with various embodiments. The process flow can be followed with the figures (FIGS. 1A-1F) discussed above and hence will not be described again.

In FIG. 7A, a process flow 70 starts with exposing a substrate comprising a dielectric layer and a metal-containing film to a first plasma generated from a pretreatment gas comprising carbon to form a first carbonaceous deposit over the dielectric layer and a second carbonaceous deposit over the metal-containing film (block 710, e.g., FIGS. 1C and 1D). In certain embodiments, an optional purging step may be inserted after the plasma pretreatment step (block 715). After forming the carbonaceous deposits on both layers, the substrate is exposed to a second plasma generated from an etch gas comprising halogen to selectively etch the second carbonaceous deposit on the metal-containing film relative to the first carbonaceous deposit on the dielectric layer, revealing the surface of the metal-containing film (block 720). Subsequently, the second plasma is exposed to the metal-containing film in addition to the first carbonaceous deposit (block 730, e.g., FIGS. 1E and 1F). At this stage, the second plasma selectively etches the metal-containing film relative to the first carbonaceous deposit, while the first carbonaceous deposit protects the dielectric layer from being etched by the second plasma. In certain embodiments, the exposure to the first plasma (block 710) and the second plasma (blocks 720 and 730) may be repeated as a part of a cyclic plasma process. Such a cyclic embodiment may advantageously benefit in accumulating the first carbonaceous deposit over the dielectric layer, for example, when the etch selectivity is not sufficiently high. In one or more embodiments, after the exposure to the second plasma (block 720), another etch process may be performed to etch the first carbonaceous deposits on the dielectric layer (block 730).

In FIG. 7B, a process flow 72 starts with exposing a substrate comprising a dielectric layer to a first halogen-containing plasma to etch a portion of the dielectric layer and expose a metal-containing film disposed under the dielectric layer (block 702, e.g., FIG. 2C). The remaining portions of the dielectric layer and the exposed metal-containing film are then exposed to a carbon-containing plasma to form a first carbonaceous deposit over the remaining portions of the dielectric layer and a second carbonaceous deposit over the exposed metal-containing film (block 712, e.g., FIG. 2D). After forming the carbonaceous deposits on both layers, the carbonaceous deposits are exposed to a second halogen-containing plasma to selectively etch the second carbonaceous deposit on the metal-containing film relative to the first carbonaceous deposit to expose a surface of the exposed metal-containing film (block 722). The second halogen-containing plasma may then be exposed to the surface of the exposed metal-containing film, selectively etch the metal-containing film relative to the first carbonaceous deposit (block 732, e.g., FIG. 2E).

In FIG. 7C, a process flow 74 starts with forming a plurality of regions over a substrate, where the plurality of regions comprises a stack of layers having a nitride layer, an oxide layer, and an organic dielectric layer (block 701). Next, the layer stack is etched by exposing the substrate to a first halogen-containing plasma (block 704), forming an opening in the plurality of regions and expose a metal-containing film disposed under the layer stack. Carbonaceous deposits are then formed over the plurality of regions by exposing the substrate to a carbon-containing plasma (block 714). Subsequently, the metal-containing film is selectively etched relative to portions of the carbonaceous deposits over the nitride layer, the oxide layer, and the organic dielectric layer, by exposing the substrate to a second halogen-containing plasma (block 734). At this stage, the portions of the carbonaceous deposits protect the nitride layer, the oxide layer, and the organic dielectric layer from being etched by the second halogen-containing plasma.

Example embodiments of the invention are summarized here. Other embodiments can also be understood from the entirety of the specification as well as the claims filed herein.

Example 1. A method of processing a substrate that includes: exposing a substrate to a first plasma generated from a pretreatment gas including carbon, the substrate including a first layer including a dielectric material and a second layer including a metal, the first plasma being exposed to the first layer and the second layer, the first plasma forming a first carbonaceous deposit over the first layer and a second carbonaceous deposit over the second layer, the first carbonaceous deposit having a different composition than the second carbonaceous deposit; exposing the first carbonaceous deposit and the second carbonaceous deposit to a second plasma generated from an etch gas including halogen, the second plasma selectively etching the second carbonaceous deposit relative to the first carbonaceous deposit to expose a surface of the second layer; and exposing the first carbonaceous deposit and the exposed surface of the second layer to the second plasma to selectively etch the second layer relative to the first carbonaceous deposit, the first carbonaceous deposit protecting the first layer from being etched by the second plasma.

Example 2. The method of example 1, where the dielectric material includes silicon or an organic material, and where the metal includes titanium or aluminum.

Example 3. The method of one of examples 1 or 2, where the second layer includes titanium nitride or aluminum oxide.

Example 4. The method of one of examples 1 to 3, where the pretreatment gas includes methane ($CH_4$).

Example 5. The method of one of examples 1 to 4, where the pretreatment gas further includes dihydrogen ($H_2$).

Example 6. The method of one of examples 1 to 5, where the first plasma and the second plasma are formed within a same plasma processing chamber, further including: purging the plasma processing chamber with an inert gas after exposing to the first plasma and before exposing to the second plasma.

Example 7. The method of one of examples 1 to 6, where the second plasma forms an additional deposit over the first carbonaceous deposit.

Example 8. The method of one of examples 1 to 7, further including repeating exposing the substrate to the first plasma, exposing the first carbonaceous deposit and the second carbonaceous deposit to the second plasma, and exposing the first carbonaceous deposit and the exposed surface of the second layer to the second plasma.

Example 9. The method of one of examples 1 to 8, further including, after and exposing the first carbonaceous deposit and the exposed surface of the second layer to the second plasma, etching the first carbonaceous deposit.

Example 10. The method of one of examples 1 to 9, where the second layer includes a metal nitride, where the substrate further includes a third layer including a metal oxide, the third layer being exposed to the first plasma and the second plasma, where the first plasma forms a third carbonaceous deposit over the third layer, and where the second plasma selectively etches the third carbonaceous deposit and the third layer relative to the first carbonaceous deposit.

Example 11. The method of one of examples 1 to 10, where the substrate further includes a third layer including another metal different from the metal in the second layer, the third layer being exposed to the first plasma, where the first plasma forms a third carbonaceous deposit over the third layer, and where the third carbonaceous deposit protects the third layer from being etched when exposed to the second plasma.

Example 12. A method of processing a substrate that includes: exposing a substrate to a first halogen-containing plasma to etch a portion of a first layer including a dielectric material and expose a second layer disposed under the first layer, the second layer including a metal; exposing the remaining portions of the first layer and the exposed second layer to a carbon-containing plasma to form a first carbonaceous deposit over the remaining portions of the first layer and a second carbonaceous deposit over the exposed second layer; exposing the first carbonaceous deposit and the second carbonaceous deposit to a second halogen-containing plasma to selectively etch the second carbonaceous deposit relative to the first carbonaceous deposit to expose a surface of the exposed second layer; and exposing the first carbonaceous deposit and the exposed surface of the exposed second layer to the second plasma to selectively etch the second layer relative to the first carbonaceous deposit.

Example 13. The method of claim 12, further including: generating the first halogen-containing plasma by applying power to a source electrode and a bias electrode in the plasma processing chamber; generating the carbon-containing plasma by flowing a pretreatment gas including carbon to the plasma processing chamber; powering the source electrode and the bias electrode in the plasma processing chamber during the exposing of the substrate to the first halogen-plasma, the generating of the carbon-containing plasma, and the exposing of the substrate to the carbon-containing plasma.

Example 14. The method of one of examples 12 or 13, where the first halogen-containing plasma and the second halogen-containing plasma are generated from a same etch gas.

Example 15. A method of processing a substrate that includes: forming a plurality of regions over the substrate, the plurality of regions including stack of layers and including a nitride layer, an oxide layer, and an organic dielectric layer; etching through the plurality of regions by exposing the substrate to a first halogen-containing plasma to form an opening in the plurality of regions and exposing an underlying metal-containing film; forming carbonaceous deposits over the plurality of regions by exposing the substrate to a carbon-containing plasma; and selectively etching the metal-containing film relative to portions of the carbonaceous deposits over the nitride layer, the oxide layer, and the organic dielectric layer, by exposing the substrate to a second halogen-containing plasma, the portions of the carbonaceous deposits protecting the nitride layer, the oxide layer, and the organic dielectric layer from being etched by the second halogen-containing plasma.

Example 16. The method of example 15, where the carbonaceous deposits are formed on a top surface of the plurality of regions and sidewalls of the opening.

Example 17. The method of one of examples 15 or 16, where the carbon-containing plasma is generated from a gas including methane ($CH_4$) and dihydrogen ($H_2$), Example 18. The method of one of examples 15 to 17, where the second halogen-containing plasma is generated from a gas including $BCl_3$.

Example 19. The method of one of examples 15 to 18, where the composition of the carbonaceous deposits on the sidewalls of the opening over the oxide layer, the nitride layer, and the organic dielectric layer are different.

Example 20. The method of one of examples 15 to 19, where selectively etching the metal-containing film forms a metal line.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
exposing a substrate to a first plasma generated from a pretreatment gas comprising carbon, the substrate comprising a first layer comprising a dielectric material and a second layer comprising a metal, the first plasma being exposed to the first layer and the second layer, the first plasma forming a first carbonaceous deposit over the first layer and a second carbonaceous deposit over the second layer, the first carbonaceous deposit having a different composition than the second carbonaceous deposit;
exposing the first carbonaceous deposit and the second carbonaceous deposit to a second plasma generated from an etch gas comprising halogen, the second plasma selectively etching the second carbonaceous deposit relative to the first carbonaceous deposit to expose a surface of the second layer; and
exposing the first carbonaceous deposit and the exposed surface of the second layer to the second plasma to selectively etch the second layer relative to the first carbonaceous deposit, the first carbonaceous deposit protecting the first layer from being etched by the second plasma.

2. The method of claim 1, wherein the dielectric material comprises silicon or an organic material, and wherein the metal comprises titanium or aluminum.

3. The method of claim 1, wherein the second layer comprises titanium nitride or aluminum oxide.

4. The method of claim 1, wherein the pretreatment gas comprises methane ($CH_4$).

5. The method of claim 1, wherein the pretreatment gas further comprises dihydrogen ($H_2$).

6. The method of claim 1, wherein the first plasma and the second plasma are formed within a same plasma processing chamber, further comprising:
purging the plasma processing chamber with an inert gas after exposing to the first plasma and before exposing to the second plasma.

7. The method of claim 1, wherein the second plasma forms an additional deposit over the first carbonaceous deposit.

8. The method of claim 1, further comprising repeating exposing the substrate to the first plasma, exposing the first carbonaceous deposit and the second carbonaceous deposit to the second plasma, and exposing the first carbonaceous deposit and the exposed surface of the second layer to the second plasma.

9. The method of claim 1, further comprising, after exposing the first carbonaceous deposit and the exposed surface of the second layer to the second plasma, etching the first carbonaceous deposit.

10. The method of claim 1, wherein the second layer comprises a metal nitride, wherein the substrate further comprises a third layer comprising a metal oxide, the third layer being exposed to the first plasma and the second plasma, wherein the first plasma forms a third carbonaceous deposit over the third layer, and wherein the second plasma selectively etches the third carbonaceous deposit and the third layer relative to the first carbonaceous deposit.

11. The method of claim 1, wherein the substrate further comprises a third layer comprising another metal different from the metal in the second layer, the third layer being exposed to the first plasma, wherein the first plasma forms a third carbonaceous deposit over the third layer, and wherein the third carbonaceous deposit protects the third layer from being etched when exposed to the second plasma.

12. A method of processing a substrate, the method comprising:
exposing a substrate to a first halogen-containing plasma to etch a portion of a first layer comprising a dielectric material and expose a second layer disposed under the first layer, the second layer comprising a metal, the substrate comprising the first layer and the second layer;

exposing the remaining portions of the first layer and the exposed second layer to a carbon-containing plasma to form a first carbonaceous deposit over the remaining portions of the first layer and a second carbonaceous deposit over the exposed second layer;

exposing the first carbonaceous deposit and the second carbonaceous deposit to a second halogen-containing plasma to selectively etch the second carbonaceous deposit relative to the first carbonaceous deposit to expose a surface of the exposed second layer; and exposing the first carbonaceous deposit and the exposed surface of the exposed second layer to the second plasma to selectively etch the second layer relative to the first carbonaceous deposit.

13. The method of claim 12, further comprising:

generating the first halogen-containing plasma by applying power to a source electrode and a bias electrode in the plasma processing chamber;

generating the carbon-containing plasma by flowing a pretreatment gas comprising carbon to the plasma processing chamber; and powering the source electrode and the bias electrode in the plasma processing chamber during the exposing of the substrate to the first halogen-containing plasma, the generating of the carbon-containing plasma, and the exposing of the substrate to the carbon-containing plasma.

14. The method of claim 12, wherein the first halogen-containing plasma and the second halogen-containing plasma are generated from a same etch gas.

15. A method of processing a substrate, the method comprising:

forming a plurality of regions over the substrate, the plurality of regions comprising a stack of layers and comprising a nitride layer, an oxide layer, and an organic dielectric layer;

etching through the plurality of regions by exposing the substrate to a first halogen-containing plasma to form an opening in the plurality of regions and expose an underlying metal-containing film;

forming carbonaceous deposits over the plurality of regions by exposing the substrate to a carbon-containing plasma; and selectively etching the metal-containing film relative to portions of the carbonaceous deposits over the nitride layer, the oxide layer, and the organic dielectric layer, by exposing the substrate to a second halogen-containing plasma, the portions of the carbonaceous deposits protecting the nitride layer, the oxide layer, and the organic dielectric layer from being etched by the second halogen-containing plasma.

16. The method of claim 15, wherein the carbonaceous deposits are formed on a top surface of the plurality of regions and sidewalls of the opening.

17. The method of claim 15, wherein the carbon-containing plasma is generated from a gas comprising methane ($CH_4$) and dihydrogen ($H_2$).

18. The method of claim 15, wherein the second halogen-containing plasma is generated from a gas comprising $BCl_3$.

19. The method of claim 15, wherein the composition of the carbonaceous deposits on the sidewalls of the opening over the oxide layer, the nitride layer, and the organic dielectric layer are different.

20. The method of claim 15, wherein selectively etching the metal-containing film forms a metal line.

* * * * *